(12) United States Patent
Aoyagi et al.

(10) Patent No.: US 8,706,954 B2
(45) Date of Patent: Apr. 22, 2014

(54) MEMORY MANAGEMENT APPARATUS AND MEMORY MANAGEMENT METHOD

(75) Inventors: Katsumi Aoyagi, Tokyo (JP); Rutger Ljungqvist, Lund (SE); Hans Wachtmeister, Lund (SE); Haekan Palm, Lund (SE); Kenji Takao, Tokyo (JP); Masaya Takahashi, Tokyo (JP); Yoshiyuki Hama, Tokyo (JP); Yimin Li, Tokyo (JP); Toshihisa Sanbommatsu, Tokyo (JP); Tomohiro Ichikawa, Tokyo (JP)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 300 days.

(21) Appl. No.: 13/105,538

(22) Filed: May 11, 2011

(65) Prior Publication Data

US 2012/0059979 A1 Mar. 8, 2012

Related U.S. Application Data

(60) Provisional application No. 61/380,576, filed on Sep. 7, 2010.

(51) Int. Cl.
*G06F 12/02* (2006.01)

(52) U.S. Cl.
USPC .................................. 711/103; 711/E12.008

(58) Field of Classification Search
CPC .............. G06F 12/0246; G06F 3/0679; G06F 2212/2022
USPC .......................................................... 711/103
See application file for complete search history.

(56) References Cited

U.S. PATENT DOCUMENTS

| 5,860,082 | A  | * | 1/1999  | Smith et al. ................... 711/103 |
| 6,260,156 | B1 | * | 7/2001  | Garvin et al. ................ 714/6.13 |
| 7,295,479 | B2 | * | 11/2007 | Yoon et al. .................... 365/200 |
| 7,797,693 | B1 | * | 9/2010  | Gustafson et al. ............ 717/168 |
| 2009/0138754 | A1 | * | 5/2009 | Edwards et al. ................. 714/6 |

FOREIGN PATENT DOCUMENTS

JP 2008-40701 2/2008

* cited by examiner

*Primary Examiner* — Charles Rones
*Assistant Examiner* — Andrew Russell
(74) *Attorney, Agent, or Firm* — Oblon, Spivak, McClelland, Maier & Neustadt, L.L.P.

(57) ABSTRACT

A terminal apparatus including a non-volatile memory for which writing is performed in units of blocks; and a control unit configured to perform a first method of managing bad blocks in the non-volatile memory with respect to blocks corresponding to an information management table in a file system of the non-volatile memory, and to perform a second method of managing bad blocks in the non-volatile memory with respect to blocks corresponding to user data in the file system.

10 Claims, 8 Drawing Sheets

FIG. 2

| ID# | BINARY NAME | |
|---|---|---|
| 1 | Comm CODE | ~21 |
| 2 | Comm FILE SYSTEM | ~22 |
| 3 | DSP | ~23 |
| 4 | Apps CODE | ~24 |
| 5 | FIRST Apps FILE SYSTEM | ~25 |
| 6 | SECOND Apps FILE SYSTEM | ~26 |
| 7 | Log | ~27 |

MEMORY MANAGEMENT APPARATUS AND MEMORY MANAGEMENT METHOD

CROSS REFERENCE TO RELATED APPLICATIONS

This application is related to and claims priority under 35 U.S.C. §119(e) to Provisional Application Ser. No. 61/380,576, filed Sep. 7, 2010, the contents of which are hereby incorporated herein by reference.

BACKGROUND

1. Field

The present specification relates to a memory management apparatus including a non-volatile memory for which writing is performed in units of blocks such as a portable terminal apparatus including a NAND memory, and a memory management method.

2. Description of the Related Art

A portable terminal apparatus (hereinafter, also simply referred to as a "portable terminal") including a cellular phone terminals and the like uses a flash memory as a rewritable non-volatile semiconductor memory. A flash memory is classified into a NAND type and a NOR type. The NAND type flash memory (hereinafter, also referred to as a "NAND memory") is suitable for large capacity and the cost per unit of capacity is low, but only a read/write operation can be performed in units of blocks of a predetermined size and random access is slow. Meanwhile, the NOR type flash memory is suitable for a high speed read operation and high speed random access, but it is not suitable for high integration and a large amount of current is necessary for writing.

The NAND memory, which is advantageous in terms of cost, high integration, power consumption and the like, may be selected as a memory provided in a portable terminal. The uses of the NAND memory are classified into two: storage of codes (programs) and storage of user data. However, it is normal for the NAND memory to already include bad blocks by the time of shipment. Furthermore, it is necessary to consider that the deterioration of the NAND memory occurs as time passes and a block with good quality at an early stage may become defective.

In this regard, in consideration of the characteristics of the NAND memory in which writing is performed in units of blocks, several BBM (Bad Block Management) methods have been proposed. The bad block management (hereinafter, also simply referred to as a "BBM") represents logic in which a bad block is detected and managed after data writing, erasing and the like in a non-volatile memory in which writing is performed in units of blocks. One of the BBM methods is a memory management method disclosed in Japanese Unexamined Patent Application Publication No 2008-40701 filed by the applicant of the present invention.

Japanese Unexamined Patent Application Publication No 2008-40701 discloses a memory management method which is suitable for software update using a differential file with respect to a non-volatile memory in which writing is performed in units of blocks. According to the memory management method, a plurality of blocks of the non-volatile memory may be classified as a "management area", a "code area", a "replacement area" and an "interference area" and the interference area is disposed between the management area and the replacement area. With such a configuration, the replacement area can be used in common by both the management area and the code area. Furthermore, the management area is provided in the non-volatile memory itself, whereby it is possible to perform replacement management of a bad block without providing a special external memory management unit.

As described above, since existing approaches for bad block management define a memory area for simply assisting the BBM, other memory areas except for the memory area are out of the management range of the BBM.

More accurately, a code (program) area allocated to the NAND memory demands the BBM. For example, the file system performs its own BBM as one function provided therein. Therefore, when the BBM is applied to the NAND memory, since a collision in memory management may occur between the original BBM and the BBM of the file system itself, the execution of a complicated BBM is necessary.

It is desirable to avoid a collision between a BBM performed out of a file system and a BBM performed as one function of the file system in a non-volatile memory in which writing is performed in units of blocks, and the BBM can be applied throughout a wide range of the non-volatile memory.

BRIEF SUMMARY

According to an embodiment a terminal apparatus is provided comprising a non-volatile memory for which writing is performed in units of blocks; and a control unit configured to perform a first method of managing bad blocks in the non-volatile memory with respect to blocks corresponding to an information management table in a file system of the non-volatile memory, and to perform a second method of managing bad blocks in the non-volatile memory with respect to blocks corresponding to user data in the file system.

According to another embodiment, a method implemented on a terminal apparatus is provided that includes a non-volatile memory for which writing is performed in units of blocks, the method comprising: performing a first method of managing bad blocks in the non-volatile memory with respect to blocks corresponding to an information management table in a file system constituting a partition table of the non-volatile memory; and performing a second method of managing bad blocks in the non-volatile memory with respect to blocks corresponding to user data in the file system.

According to another embodiment, a computer readable storage medium encoded with computer executable instructions is provided, which when executed by a terminal apparatus that includes a non-volatile memory for which writing is performed in units of blocks, causes the terminal apparatus to perform a method comprising: performing a first method of managing bad blocks in the non-volatile memory with respect to blocks corresponding to an information management table in a file system constituting a partition table of the non-volatile memory; and performing a second method of managing bad blocks in the non-volatile memory with respect to blocks corresponding to user data in the file system.

Thus, according to an embodiment described herein, when managing a non-volatile memory for which writing is performed in units of blocks, bad block management is performed by allocating a plurality of blocks of the non-volatile memory to at least a management area and a replacement area, wherein the management area includes at least one block for storing management information and the replacement area includes a plurality of blocks for replacing bad blocks. At this time, first bad block management is performed with respect to an information management table in a file system constituting a partition table of the non-volatile memory, and second bad block management provided in the file system as one function thereof is applied to user data in the file system.

According to the embodiment, the first bad block management is performed with respect to the information management table in the file system, and the second bad block management provided in the file system as one function thereof is applied to the user data in the file system. Thus, it is possible to avoid a collision (e.g., competition of access to a replacement area) of memory management of the first bad block management performed out of the file system and the second bad block management provided in the file system as one function thereof.

According to the embodiment, bad block management can be applied to a non-volatile memory, for which writing is performed in units of blocks, throughout a wide range of the non-volatile memory as compared with the related art, while avoiding a collision between bad block management, which is performed out of the file system, and bad block management which is performed as one function of the file system.

BRIEF DESCRIPTION OF THE DRAWINGS

FIG. 2 is a diagram explaining one example of a binary image of a NAND memory.

DETAILED DESCRIPTION

Figure 1:
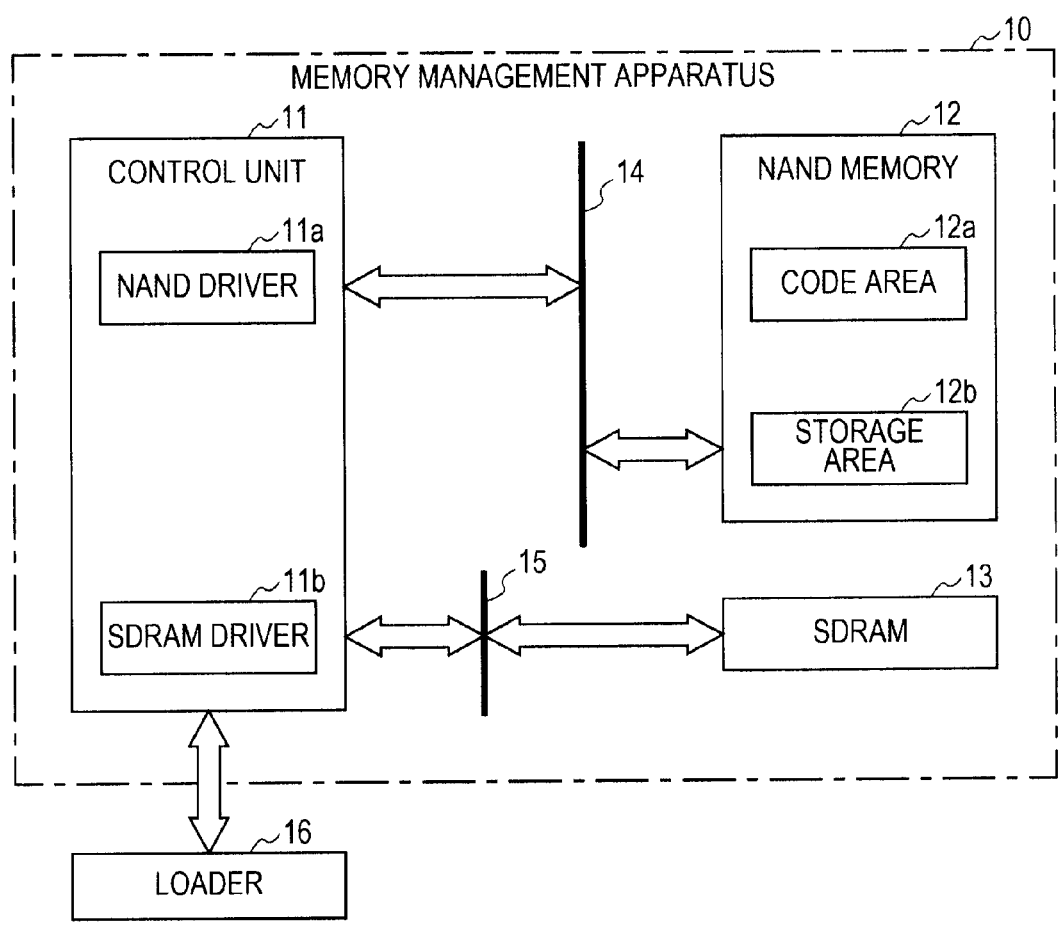
FIG. 1 is a block diagram illustrating a configuration example of a memory management apparatus employing a memory management method according to a first embodiment.

Hereinafter, embodiments will be described with reference to the accompanying drawings. Description will be given according to the following sequence. In addition, the same reference numerals are used to designate the common element in respective drawings in order to avoid redundancy.

1. First Embodiment (an example in which an area for bad block management is in a file system)

2. Second Embodiment (an example in which an area for bad block management is out of the file system)

3. Others (example in which a memory management apparatus is applied to a portable terminal)

1. First Embodiment

FIG. 1 is a block diagram illustrating a configuration example of a memory management apparatus employing a memory management method (bad block management: BBM) according to the first embodiment.

The memory management apparatus 10 includes a control unit 11, a NAND memory 12, a SDRAM (Synchronous Dynamic Random Access Memory) 13, and buses 14 and 15.

The control unit 11 includes a processor such as a CPU (Central Processing Unit) or a DSP (Digital Signal Processor) and performs processing of the memory management apparatus 10 and control of each element. The control unit 11 has a function as a NAND driver 11a, which performs data communication with respect to the NAND memory 12 through the bus 14, and a function as a SDRAM driver 11b, which performs data communication with respect to the SDRAM 13 of a working memory through the bus 15.

The NAND memory 12 is a rewritable non-volatile memory that stores programs executed by the control unit 11. The NAND memory 12 roughly includes a code area 12a that stores code (program code) of a program itself and a storage area 12b that stores files for updating. The storage area 12b can store various pieces of data such as a phone book, electronic mail, web content, music or image in addition to programs.

The content of the code area 12a is extracted (copied) to the SDRAM 13 during booting (start), and the programs are executed on the SDRAM 13. In more detail, if power is supplied to the control unit 11, the NAND memory 12 and the SDRAM 13, the content (program) of the boot area of the NAND memory 12 is executed after being read to the memory area in the control unit 11 by the embedded logic of the control unit 11. The program includes an algorithm for executing the memory management method according to the first embodiment. Program code to be executed by the program is extracted to the SDRAM 13 from the NAND memory 12, and the programs are executed on the SDRAM 13. For example, an update file is created in advance by a dedicated tool external to the memory management apparatus 10, is downloaded from a dedicated server through a communication unit (not shown), and is stored in the storage area 12b of the NAND memory 12.

A loader 16 is configured to load programs to the NAND memory 12 through the control unit 11 at the time of program upgrade such that the programs are stored therein. For example, data communication between the control unit 11 and the loader 16 is performed using a UART (Universal Asynchronous Receiver Transmitter) or a USB interface.

As described above, the present applicants propose the BBM in Japanese Unexamined Patent Application Publication No 2008-40701. Under the more practical conditions, it is necessary to accurately review an area to which the BBM is applicable and an area to which the BBM is not applicable.

FIG. 2 illustrates one example of a binary image of data preserved in the NAND memory.

The binary image 20 of the example includes a common code (Commcode) 21, a common file system (Commfilesystem) 22, a DSP 23, application software code (Appscode) 24, a first application software file system (first Appsfilesystem) 25, a second application software file system (second Appsfilesystem) 26, and a Log 27. The binary image will be called a "partition table" later.

The common code 21 is an area that includes code (programs) used when the memory management apparatus 10 communicates with the outside. Furthermore, the common file system 22 is an area that includes data such as parameters according to communication. The DSP 23 is an area that includes codes of firmware for driving a DSP of the control unit 11 and parameters.

The application software code 24 is an area that includes codes (programs) of application software. Furthermore, the first application software file system 25 and the second application software file system 26 are areas that include data generated by executing the application software. The Log 27, for example, is an area that includes an operation history of the control unit 11. In addition, the binary image 20, for example, includes a boot area (not shown) and the like.

ID# in the binary image 20 illustrated in FIG. 2 is basically made to correspond to the physical addresses of the NAND memory. One solution for appropriately performing the BBM is to select IDs 1, 3 and 4 as areas to which the BBM is applicable and select IDs 2, 5 and 6 as areas to which the BBM is not applicable. The reason for selecting the IDs 2, 5 and 6 as the areas, to which the BBM is not applicable, is because data of the areas is managed by the file system.

Figure 3:
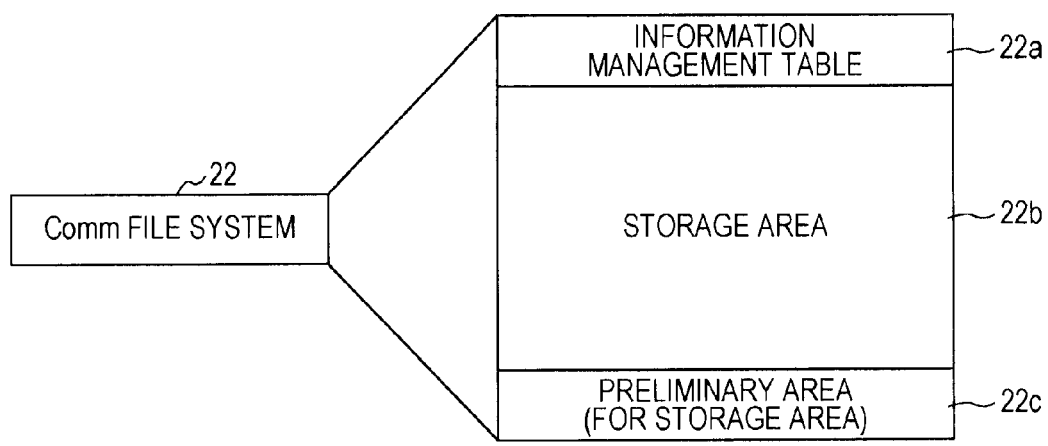
FIG. 3 is a diagram explaining a configuration example of a common file system.

The structure of the file system mainly includes an information management table, a storage area (user data), and a preliminary area prepared for the case where a bad area occurs. For example, as illustrated in FIG. 3, the common file system 22 includes an information management table 22a, a storage area (user data) 22b, and a preliminary area 22c. The preliminary area 22c is an area to be used when a bad area occurs in the storage area 22b.

Figure 4:
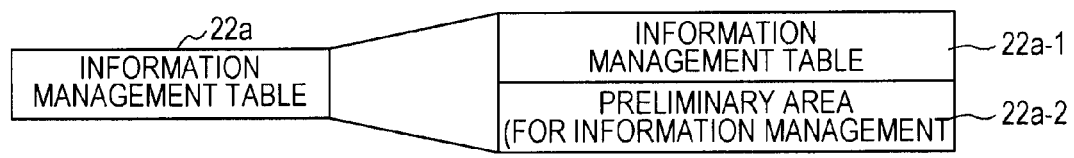
FIG. 4 is a diagram explaining a configuration example of an information management table.

The file system is configured to necessarily update the information management table if the storage area is accessed. That is, this means that it is necessary for the file system to prepare the preliminary area in the information management table in consideration of a case where a bad area occurs in the information management table. This is illustrated in FIG. 4. FIG. 4 illustrates a configuration example of the information management table. The information management table 22a includes an information management table 22a-1 and a preliminary area 22a-2. The preliminary area 22a-2 is an area to be used when a bad area occurs in the information management table.

It is established in by almost all memory manufacturing companies that the initial number of bad blocks in a NAND memory is to be smaller than 2%. A "block" in the present application indicates a unit area with a specific size in each memory device. However, the generation of bad blocks differs by memory manufacturing companies and may be concentrated in the information management table and a preliminary area thereof. In the case of using a 1 Gigabyte NAND memory, the initial maximum number of bad blocks is by design about 80 when considering a defect ratio of 2%. Therefore, in general, only a small number of blocks are allocated to a preliminary area guaranteed for the bad block.

When bad blocks are concentrated in the preliminary area 22a-2 for the information management table, since the loader 16 does not load the common file system to the NAND memory, the load process fails. Meanwhile, the number of blocks of the preliminary area is increased, causing a state where the storage area is small (is insufficient). As can be understood from the above considerations, it is necessary to review the method by which the BBM is applied to the file system.

In this regard, the bad block management according to the first embodiment is performed with respect to the information management table in the file system constituting the partition table of the NAND memory, and bad block management provided in the file system as one function is further performed with respect to the user data in the file system.

Before the description of the proposal of a novel memory management method (bad block management) by the applicant, five technical terms related to access to the NAND memory are defined.

(1) Write Remapping

When a bad block is detected by the process (program update) at the time of erasing or writing, the bad block is replaced with a preliminary memory area (e.g., a replacement area) prepared in advance. For example, write remapping is preferably applied to an access process (refer to FIG. 7) to the NAND memory when it is highly necessary to reliably resolve an initial bad block by using a replacement area.

(2) Write Mapping

When a bad block is detected by the process at the time of erasing or writing, the bad block is simply skipped over and shift to the next block is performed in order to find the next good block without replacing the bad block with a preliminary memory area (e.g., a replacement area) prepared in advance. However, access to the shifted block is performed through the preliminary memory area prepared in advance. For example, the write mapping is preferably applied to an access process (refer to FIG. 7) to the NAND memory when the necessity of removing an initial bad block without using a replacement area (while saving the replacement area) is relatively high.

(3) Write w/o Mapping (no BBM)

When a bad block is detected by erasing or writing execution, the bad block is simply skipped over and shift to the next block is performed in order to find the next good block regardless of the preliminary memory area (e.g., the replacement area) prepared in advance. In this access process, the BBM is not correlated.

(4) Read Mapping

An appropriate block is read with reference to a mapping table (a physical/logical address conversion table) created during write remapping.

(5) Read w/o Mapping (no BBM)

A designated block is read. In this access process, the BBM is not correlated.

A combination of write remapping and write mapping is a novel concept proposed by the applicant. Hereinafter, the concept will be described with reference to FIG. 5.

Figure 5:
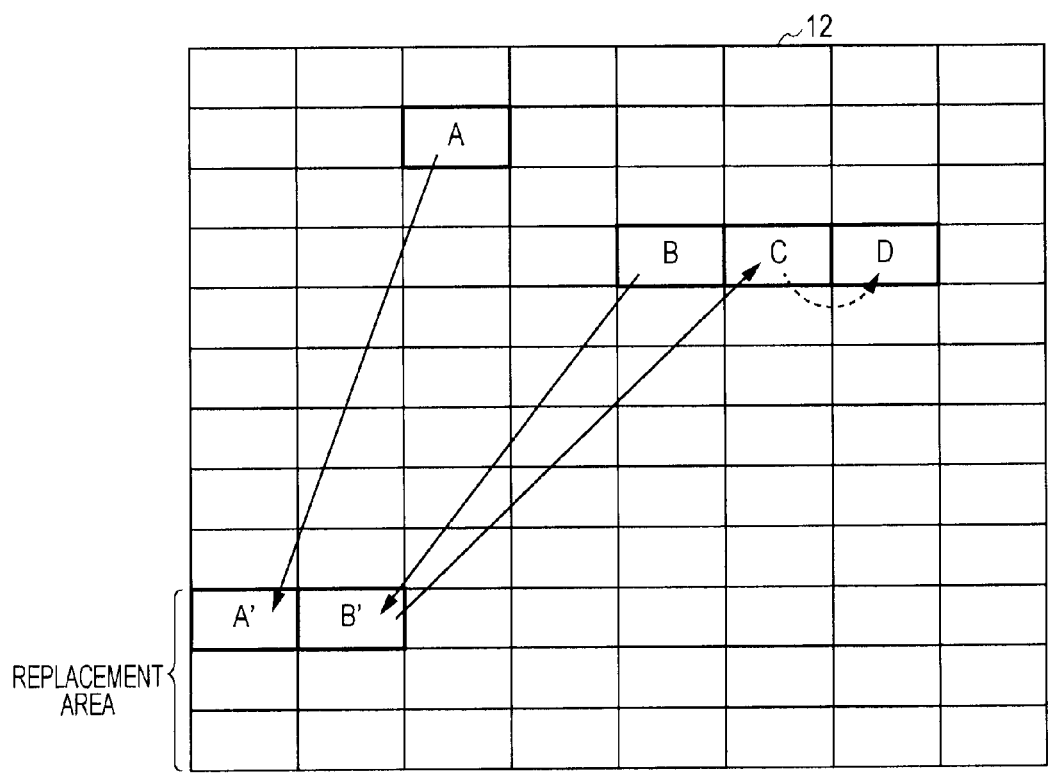
FIG. 5 is a diagram explaining a block conversion concept in a NAND memory according to a first embodiment.

FIG. 5 is a diagram explaining a block conversion concept in the NAND memory according to the first embodiment. The NAND memory 12 illustrated in FIG. 5 ensures a replacement area as an area for replacing a bad block.

In FIG. 5, when a block A is detected as a bad block, the block A is changed to a block A' allocated to the replacement area by write remapping. In a similar manner, a block B is also changed to a block B' allocated to the replacement area. The block A and the block B are not used. In addition, when a bad block is detected in the block B', shift to a next good block in the replacement area is performed.

Then, when the block B (an actual block is B') has already changed to a bad block, the block B is detected as a bad block. At this time, if a block C is a good block, the block B is changed to the block C by write mapping. When the block C is also a bad block, the block C is skipped over and the next block D is selected by write mapping.

The information management table and the preliminary area are used to manage management information such as "corresponding information of a replacement destination" or the "bad block information in an area for management" as illustrated in Japanese Unexamined Patent Application Publication No 2008-40701 (refer to FIG. 7) as one example. The management information is stored in blocks of physical addresses of the NAND memory corresponding to the logical addresses of the file system.

When a proper unused block of the replacement area is allocated as a replacement destination of a specific block, the "corresponding information of the replacement destination" represents a correspondence relationship thereof. Herein, the block number of the bad block and the block number of the replacement area are made to correspond to each other for management.

Furthermore, a management area, an interference area, and a replacement area (refer to FIG. 8), which will be described later, are areas for management. "Bad block information in the areas for management" is information (herein, block number) for specifying a bad block which is recorded when a block of any one of the areas for management is defective.

Description will be given by applying the above-described concept to the information management table and the preliminary area thereof in the file system.

Figure 6:
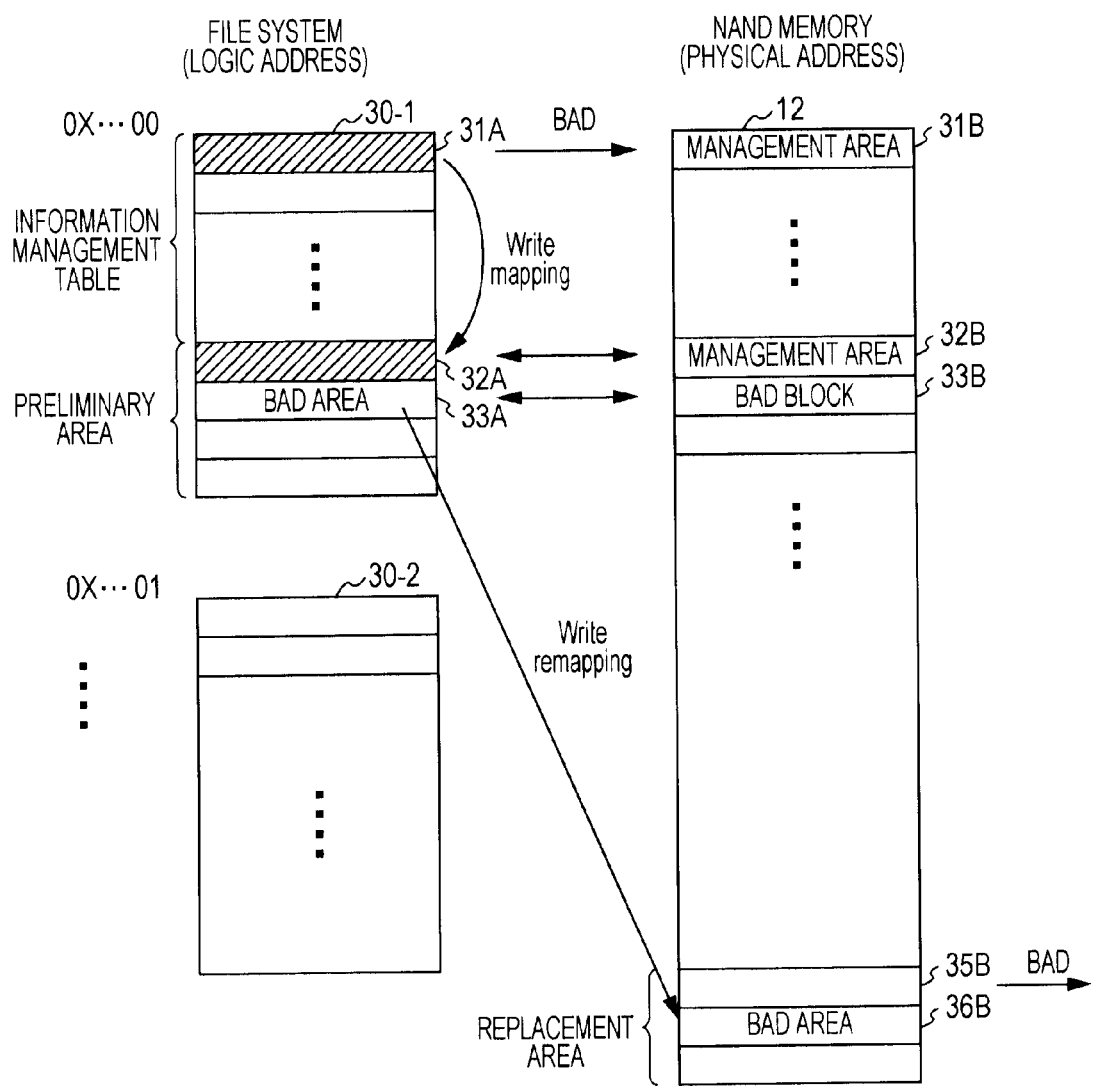
FIG. 6 is a diagram explaining a relationship between an area corresponding to a logical address of a file system and a block corresponding to a physical address of a NAND memory according to a first embodiment.

FIG. 6 is a diagram illustrating a relationship between areas corresponding to the logic addresses of the file system and blocks corresponding to the physical addresses of the NAND memory according to the first embodiment.

In the example of FIG. 6, binary data recorded in the NAND memory 12 includes a file system 30-1, which employs a logic address 0X . . . 00 as a start address, and a file system 30-2, which employs a logic address 0X . . . 01 as a start address.

For example, when an area 31A of the information management table of the file system 30-1 is defective, that is, a block 31B (a management area) of the corresponding NAND memory 12 becomes a bad block, the process for replacing the area 31A of the information management table with a block 35B of the replacement area of the NAND memory 12 is write remapping. Herein, when the block 35B of the replacement area of the NAND memory 12 becomes a bad block, the process for changing the block 35B to an area 32A of the preliminary area of the file system 30-1 without using a preliminary area anew is write mapping. In such a case, access to the block 31B (the management area) of the NAND memory 12 corresponding to the area 31A of the information management table, that is, access to a block 32B of the NAND memory 12 corresponding to the area 32A of the preliminary area after the change is performed through the block 35B of the preliminary area.

Furthermore, for example, when an area 33A of the preliminary area of the file system 30-1 is defective, that is, a block 33B of the corresponding NAND memory 12 becomes a bad block, a process for replacing the area 33A of the preliminary area with a block 36B of the replacement area of the NAND memory 12 is write remapping.

As can be understood from the above-described example, write remapping is combined with write mapping, resulting in a change in the use rate of the preliminary area in the file system and the preliminary area and the NAND memory. That is, when a block of the NAND memory corresponding to an arbitrary area of the information management table is defective, the block is changed to the replacement area without using the preliminary area in the case of applying write remapping whereas the preliminary area is used in the case of applying write mapping. In addition, when a block of the NAND memory corresponding to an arbitrary area of the preliminary area is defective, it is possible to select whether to apply write remapping or write mapping, and the selection of write remapping or write mapping is preset according to the process (the access process to the NAND memory) of the memory management apparatus. Hereinafter, selective switching of the content of the bad block management will be referred to as a "selective BBM".

As described above, when program codes in the NAND memory are transmitted to the SDRAM in units of blocks, the bad block management disclosed in the first embodiment is performed. After the program codes in the NAND memory are transmitted to the SDRAM in units of blocks, the bad block management provided in the file system as one function is applied.

Figure 7:
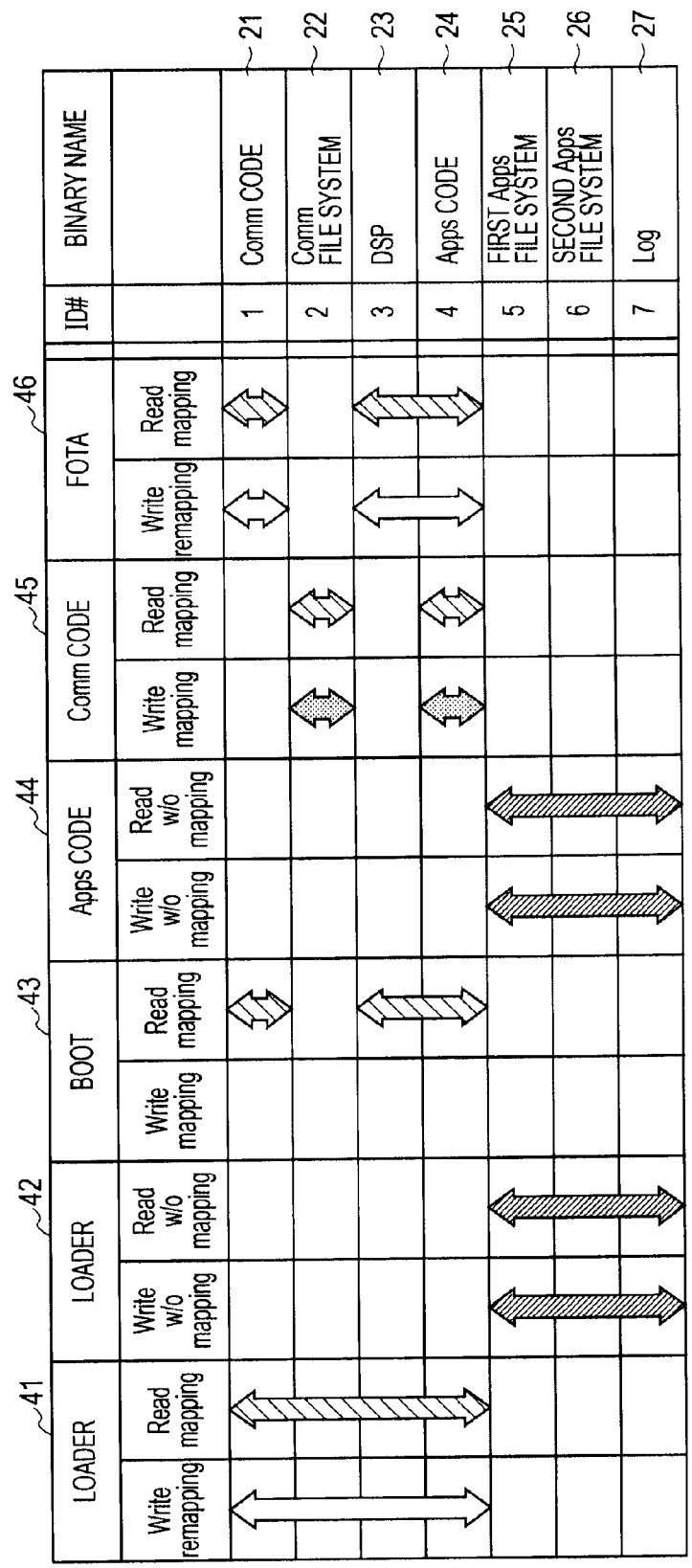
FIG. 7 is a diagram explaining bad block management (selective BBM) according to a first embodiment.

FIG. 7 is a diagram explaining the bad block management (the selective BBM) according to the first embodiment.

In this example, a typical boot process of the NAND memory will be described as one example. According to the typical boot process of the NAND memory, for example, the common code 21 and the application software code 24 are transmitted to the SDRAM 13 from the NAND memory 12 at the time of start and programs are executed in the SDRAM 13 after all codes are transmitted. Hereinafter, an example of the selective BBM according to the process content will be described.

(1) Loader 41

According to the process of the loader 41, the binary data of the ID1 (the common code 21), the ID2 (the common file system 22), the ID3 (the DSP 23) and the ID4 (the application software code 24) are loaded to the NAND memory 12. The control unit 11 is configured to apply write remapping to the ID1 to ID4 for the loader 41 and replace all initial bad blocks with replacement areas.

(2) Loader 42

According to the process of the loader 42, the binary data of the ID5 (the first application software file system 25), the ID6 (the second application software file system 26), and the ID7 (the Log 27) are loaded to the NAND memory 12. The control unit 11 is configured to apply the write w/o mapping to the ID5 to ID7 for the loader 42 and perform the bad block management by the file system other than the selective BBM.

(3) Common Code 45

According to the process of the common code 45, the binary data of the ID2 and ID4 is performed with respect to the NAND memory 12. The control unit 11 is configured to apply the write mapping to the ID2 and ID4 for the common code 45 and perform access to the NAND memory 12 via the preliminary memory area (e.g., the replacement area) prepared in advance. However, a bad block is not replaced.

(4) Application Soft Code 44

According to the process of the application soft code 44, the binary data of the ID5 to ID7 is performed with respect to the NAND memory 12. The control unit 11 is configured to apply the writing w/o mapping to the ID5 to ID7 for the application soft code 44 and perform the bad block management by the file system other than the selective BBM.

(5) Process Elements Having Write Remapping & Write Mapping Functions

The control unit 11 is configured to apply the read mapping to process elements having write remapping and write mapping functions. In the example of FIG. 7, the read mapping is applied to the loader 41, the boot 43, the common code 45 and the FOTA (Firmware Over The Air) 46. In addition, the boot 43 is a process for temporarily copying information in the NAND memory to the SDRAM. Furthermore, the FOTA represents downloading of an update program to a portable terminal via a wireless network.

(6) Process Elements Having Write w/o Mapping Function

The control unit 11 is configured to apply the read w/o mapping to process elements having the write w/o mapping function. In the example of FIG. 7, the read w/o mapping is applied to the loader 42 and the application soft code 44.

Of course, a bad block can be replaced with the preliminary memory area (e.g., the replacement area) prepared in advance by applying write remapping to all ID#. In addition to the example of FIG. 7, the selective BBM can be adapted to any combinations.

According to the first embodiment as described above, the selective BBM can be performed using the combination of write remapping and write mapping. For example, when many bad blocks are included in blocks of the NAND memory corresponding in the information management table of the common file system, the bad blocks are replaced with the preliminary memory area (e.g., the replacement area) prepared in advance. Consequently, even if the bad blocks are concentrated in the information management table, no problems occur in the actual access process to the NAND memory. Furthermore, it can be regarded that all preliminary areas for the information management table include a plurality of blocks which are treated as good blocks.

Herein, the difference between the memory management method (the selective BBM) according to the first embodiment and the existing approach for the BBM will be further described more clearly. For example, description will be given on the assumption that the common file system is included in the area to which the BBM is applicable. According to the existing approach for the BBM, all functions of the BBM are to be performed when common codes operate. However, this means that a complicated design is necessary in order to avoid a collision between the BBM performed outside the file system and operation of the file system which performs the BBM as a function provided therein. According to the selective BBM of the first embodiment, the initial bad block is converted to the preliminary memory area prepared in advance, which is simply performed as a function of the file system. As a result, a complicated structure for adjusting the collision on the bad block management is not necessary, and the BBM can be applied to the file system by using a simple configuration.

An appropriate access process performed by each memory management apparatus (the control unit 11), which accesses the NAND driver 11a (refer to FIG. 1), will be described. The control unit 11 is configured to perform the access process according to the partition table (e.g., the binary image 20 of FIG. 2). The partition table is stored in the NAND memory 12 and the control unit 11, for example, selects modes (write remapping, write mapping and the like) of the access process for each process element defined in FIG. 7. Even if the partition table is not be received, the control unit 11 can recognize the mode of the access process in advance and operate according to the system design.

In addition, a NAND driver for processing the common code and the application software code may vary depending on memory management apparatuses. In such a case, it is possible to define access to the NAND memory based on a NAND driver type, which corresponds to a simple process as with all application software code processes which can be introduced by the write w/o remapping and the read w/o remapping.

2. Second Embodiment

The memory management method (the selective BBM) according to the first embodiment, for example, can be applied to the invention disclosed in Japanese Unexamined Patent Application Publication No 2008-40701. The invention disclosed in Japanese Unexamined Patent Application Publication No 2008-40701 can be adapted to write remapping, write mapping and read mapping functions according to the first embodiment. In this regard, as the second embodiment, an example in which the memory management method according to the first embodiment is applied to the invention disclosed in Japanese Unexamined Patent Application Publication No 2008-40701 will be described.

Figure 8:
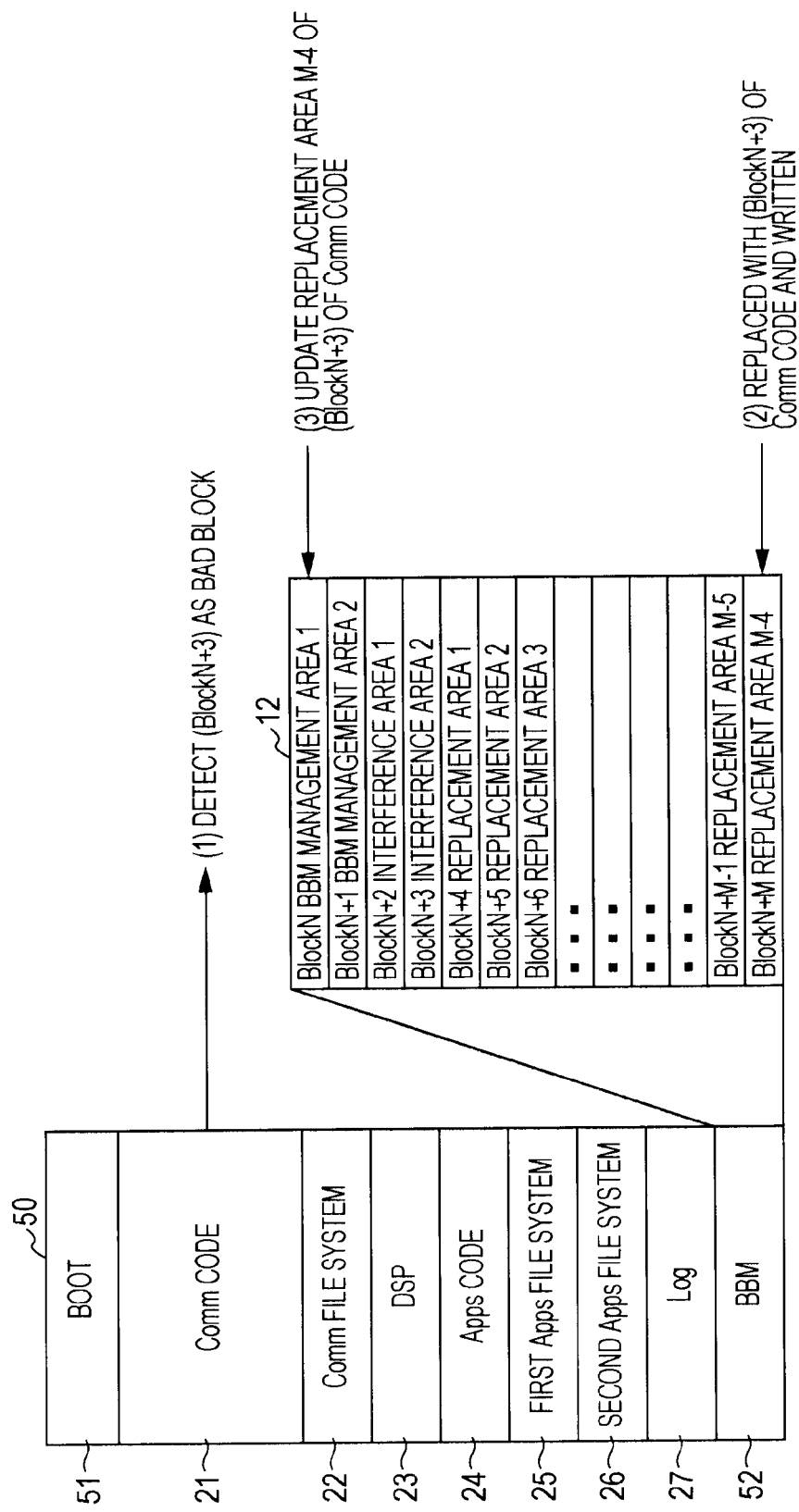
FIG. 8 is a diagram explaining bad block management according to a second embodiment.

FIG. 8 is a diagram explaining bad block management according to the second embodiment.

The first embodiment is an example in which the information management table and the preliminary area thereof in the file system are used for the bad block management. However, according to the second embodiment, an area for the bad block management is provided outside the file system and management of a bad block and block replacement management are performed by storing management information in the area.

A binary image 50 further includes areas for a boot 51 and a BBM 52 differently from the binary image 20 (refer to FIG. 2). The BBM 52 is an area which manages management information for managing the bad block. A block of the NAND memory 12 corresponding to the BBM 52 of the binary image 50 is divided into a "BBM management area", an "interference area" and a "replacement area".

The BBM management area is an area which stores management information for managing the bad block and the replacement block of the NAND memory 12. The management information includes the "corresponding information of the replacement destination" or the "bad block information in an area for management" as illustrated in Japanese Unexamined Patent Application Publication No 2008-40701 (refer to FIG. 7) as one example. Furthermore, the interference area is an area used in order to distinguish the boundary between the BBM management area and the replacement area. The replacement area is guaranteed as an area for replacing the bad block.

When it is determined that a defect is detected in a BlockN+3 of the NAND memory 12 corresponding to the common code 21 of the binary image 50 and writing may not be possible, the BlockN+3 is marked as a bad block and prohibited from being used. A code to be written in the BlockN+3 is written in a BlockN+M (a replacement area M−4) of the NAND memory 12 corresponding to the BBM 52, instead of the next BlockN+4, which is called write remapping. The replacement information is stored in a BlockN (a BBM management area 1) of the NAND memory 12 corresponding to the BBM 52. In this example, the replacement area M−4 stores replacement information for replacing the BlockN+3.

When the bad block is detected as described above, the bad block is replaced with the replacement area and management information of the BBM management area, which defines address conversion of physical addresses/logical addresses, is updated. The bad block and the replacement block are managed using the management information, so that it is possible to allow actual physical addresses to correspond to logical addresses and to perform the address conversion for converting the logical addresses into the physical addresses. According to the second embodiment, the BBM52, which is an area for the bad block management, is provided outside the file system, so that an area (e.g., a preliminary area) for the bad block management in the file system can be small, resulting in an increase in a storage area.

3. Others

Figure 9:
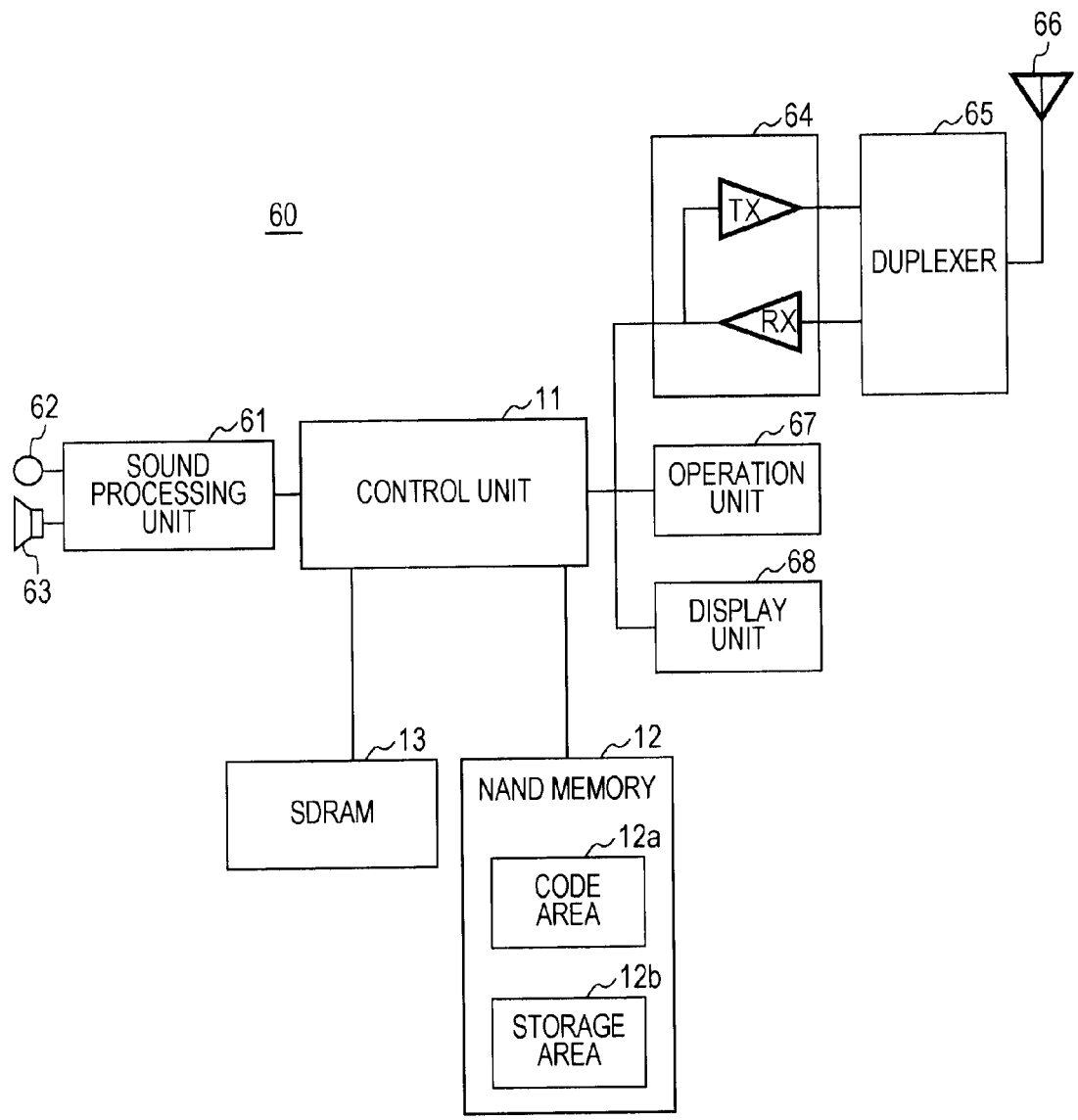
FIG. 9 is a block diagram illustrating a configuration example of a portable terminal as a memory management apparatus employing a memory management method according to an embodiment.

FIG. 9 is a block diagram illustrating a configuration example of a portable terminal as a memory management apparatus to which the memory management method of an embodiment is applied. In FIG. 9, the same reference numerals are used to designate the same elements as those of the memory management apparatus 10 illustrated in FIG. 1, and detailed thereof will be omitted.

The portable terminal 60 includes the control unit 11, a voice processing unit 61, a microphone 62, a speaker 63, the NAND memory 12, the SDRAM 13, a communication unit 64, a duplexer 65, an antenna 66, and an operation unit 67, and a display unit 68. The voice processing unit 61 is configured to perform a voice process such as communication or music play under the control of the control unit 11, receive audio data from the microphone 62, and output audio data to the speaker 63.

The control unit 11 has a processor such as a CPU (Central Processing Unit) or a DSP (Digital Signal Processor), and performs processes of the portable terminal 10 and control of each element. The voice processing unit 61 is configured to perform a voice process such as communication or music play under the control of the control unit 11, receive audio data from the microphone 62, and output audio data to the speaker 63.

The communication unit 64 is an element that performs wireless transmission/reception with respect to a base station (not shown) through the antenna 66 and the duplexer 65 under the control of the control unit 11. The operation unit 67 has ten keys, various control keys and the like, and has a function of inputting instructions or information by a user to the control unit 11. The display unit 68, for example, has a display device such as an LCD or an organic EL, and has a function of displaying visible information such as text or images (still images and moving images) with respect to a user.

The claimed invention is not limited to the previous embodiments as described above. That is, it goes without saying that various modifications and applications can be made without departing from the scope and spirit of the invention as disclosed in the accompanying claims. As the portable terminal, a cellular phone terminal has been described as an example. However, the portable terminal is not limited to a phone terminal.

Furthermore, the present specification can be applied to the case where it is generally necessary to rewrite the content of a block of a part of a NAND memory without having influence on other blocks.

In addition, the present specification is preferably applied to a NAND type flash memory. However, the present specification may be applied to a NOR type flash memory.

Moreover, an OS (Operating System) operating on a computer and the like may perform a part or the whole of the actual process based on the instructions of program code for realizing the memory management method of the present specification, and the functions of the above-described embodiments may be realized by the process.

It should be understood by those skilled in the art that various modifications, combinations, sub-combinations and alterations may occur depending on design requirements and other factors insofar as they are within the scope of the appended claims or the equivalents thereof.

What is claimed is:

1. A terminal apparatus comprising:
    a non-volatile memory for which writing is performed in units of blocks; and
    a control unit configured to perform a first method of managing bad blocks in the non-volatile memory with respect to blocks corresponding to an information management table in a file system of the non-volatile memory, and to perform a second method of managing bad blocks in the non-volatile memory with respect to blocks corresponding to user data in the file system,
    wherein the control unit is configured to allocate a plurality of blocks of the non-volatile memory to at least a management area and a replacement area, the management area including at least one block for storing management information, and the replacement area including a plurality of blocks for replacing bad blocks,
    wherein the first method of managing bad blocks is write remapping which includes replacing a bad block with a block in the replacement area,
    wherein the second method of managing bad blocks is write mapping which includes shifting to a next block by skipping over the bad block and performing access to the next block, which is not in the replacement area, without replacing the bad block with a block in the replacement area, and
    a selection of one of a plurality of types of methods of managing bad blocks, which includes at least the first method and the second method of managing bad blocks, is based on predetermined rules according to a combination, out of a predetermined plurality of combinations, of a type of process performed on the terminal apparatus and a type of data being accessed in the non-volatile memory, wherein the type of method of managing bad blocks is set in advance for each of the plurality of combinations based on a necessity to save the replacement area in view of each particular combination of the type of process and the type of data being accessed.

2. The terminal apparatus according to claim 1, wherein the control unit performs the first method of managing bad blocks when program code in the non-volatile memory is transmitted to a working memory in units of blocks, and performs the second method of managing bad blocks after the program code in the non-volatile memory is transmitted to the working memory in units of blocks.

3. The terminal apparatus according to claim 1, wherein the control unit is configured to create a physical address to logical address conversion during table write remapping or write mapping, and when reading data from the non-volatile memory, read mapping is performed in which a respective block is read with reference to the physical address to logical address conversion table.

4. The terminal apparatus according to claim 1, wherein for at least one type of process performed on the terminal apparatus, a method of write without mapping is performed when a bad block is detected, which includes skipping over the bad block and shifting to a next block regardless of the replacement area.

5. The terminal apparatus according to claim 1, wherein the type of data being accessed in the non-volatile memory is defined by a partition table which is a binary image of the data stored on the non-volatile memory, and the type of method of managing bad blocks for each type of process performed on the terminal apparatus is specified for each area of the partition table.

6. The terminal apparatus according to claim 5, wherein the partition table includes an area outside of the file system for managing bad blocks.

7. The terminal apparatus according to claim 6, wherein the area outside the file system includes:
    at least one block as a bad block management area for storing management information for managing a bad block and a replacement block of the non-volatile memory,
    at least one block as a replacement area, and
    at least one block as an interference area that is used to distinguish a boundary between the bad block management area and the replacement area.

8. The terminal apparatus according to claim 1, wherein the non-volatile memory is a NAND memory.

9. A method implemented on a terminal apparatus that includes a non-volatile memory for which writing is performed in units of blocks, the method comprising:
    performing a first method of managing bad blocks in the non-volatile memory with respect to blocks corresponding to an information management table in a file system constituting a partition table of the non-volatile memory; and performing a second method of managing bad blocks in the non-volatile memory with respect to blocks corresponding to user data in the file system, wherein the method further includes:

allocating a plurality of blocks of the non-volatile memory to at least a management area and a replacement area, the management area including at least one block for storing management information, and the replacement area including a plurality of blocks for replacing bad blocks, wherein the first method of managing bad blocks is write remapping which includes replacing a bad block with a block in the replacement area, wherein the second method of managing bad blocks is write mapping which includes shifting to a next block by skipping over the bad block and performing access to the next block, which is not in the replacement area, without replacing the bad block with a block in the replacement area, and selecting one of a plurality of types of methods of managing bad blocks, which includes at least the first method and the second method of managing bad blocks, based on predetermined rules according to a combination, out of a predetermined plurality of combinations, of a type of process performed on the terminal apparatus and a type of data being accessed in the non-volatile memory, wherein the type of method of managing bad blocks is set in advance for each of the plurality of combinations based on a necessity to save the replacement area in view of each particular combination of the type of process and the type of data being accessed.

10. A computer readable storage medium encoded with computer executable instructions, which when executed by a terminal apparatus that includes a non-volatile memory for which writing is performed in units of blocks, causes the terminal apparatus to perform a method comprising:

performing a first method of managing bad blocks in the non-volatile memory with respect to blocks corresponding to an information management table in a file system constituting a partition table of the non-volatile memory; and performing a second method of managing bad blocks in the non-volatile memory with respect to blocks corresponding to user data in the file system, wherein the method further includes:

allocating a plurality of blocks of the non-volatile memory to at least a management area and a replacement area, the management area including at least one block for storing management information, and the replacement area including a plurality of blocks for replacing bad blocks, wherein the first method of managing bad blocks is write remapping which includes replacing a bad block with a block in the replacement area, wherein the second method of managing bad blocks is write mapping which includes shifting to a next block by skipping over the bad block and performing access to the next block, which is not in the replacement area, without replacing the bad block with a block in the replacement area, and selecting one of a plurality of types of methods of managing bad blocks, which includes at least the first method and the second method of managing bad blocks, based on predetermined rules according to a combination, out of a predetermined plurality of combinations, of a type of process performed on the terminal apparatus and a type of data being accessed in the non-volatile memory, wherein the type of method of managing bad blocks is set in advance for each of the plurality of combinations based on a necessity to save the replacement area in view of each particular combination of the type of process and the type of data being accessed.

\* \* \* \* \*